United States Patent [19]

Fujimoto

[11] Patent Number: 4,712,939
[45] Date of Patent: Dec. 15, 1987

[54] SUBSTRATE SUPPORT OF INTEGRAL CONSTRUCTION

[75] Inventor: Nobuaki Fujimoto, Okazaki, Japan

[73] Assignee: Kitagawa Industries Co., Ltd., Nagoya, Japan

[21] Appl. No.: 815,024

[22] Filed: Dec. 31, 1985

[30] Foreign Application Priority Data

Jan. 11, 1985 [JP] Japan .................. 60-2610[U]

[51] Int. Cl.$^4$ .................. F16B 5/06; H05K 7/12
[52] U.S. Cl. .................. 403/24; 403/405.1; 24/297; 24/453; 411/508; 174/138 D
[58] Field of Search .................. 403/24, 405.1, 407.1, 403/252, 408.1, 406.1; 24/453, 573, 326, 297, 336, 458; 411/508, 509, 510; 174/138 D

[56] References Cited

U.S. PATENT DOCUMENTS

| | | | |
|---|---|---|---|
| 4,493,580 | 1/1985 | Ruehl | 403/252 |
| 4,527,312 | 7/1985 | Ruehl et al. | 24/453 |
| 4,579,478 | 4/1986 | Takahashi | 403/406.1 |
| 4,589,794 | 5/1986 | Sugiura et al. | 403/405.1 |
| 4,627,760 | 12/1986 | Yagi et al. | 403/405.1 |
| 4,644,614 | 2/1987 | Mizusawa | 174/138 D |

FOREIGN PATENT DOCUMENTS

| | | | |
|---|---|---|---|
| 2143377 | 1/1985 | United Kingdom | 403/405.1 |
| 2143576 | 2/1985 | United Kingdom | 403/405.1 |

*Primary Examiner*—Andrew V. Kundrat
*Assistant Examiner*—Peter M. Cuomo
*Attorney, Agent, or Firm*—Oblon, Fisher, Spivak, McClelland, & Maier

[57] ABSTRACT

A substrate support of integral construction, by which substrate (20, 39) can be fixed angularly to a plate (22, 40) and which comprising a base (3, 33), a fixing portion (1, 31) for coupling the base (3, 33), a first projection (7, 37) extending from the base (3, 33), and a second projection (8, 38) extending from a wall (9) extending from the base (3, 33). The substrate (20) is gripped by the base (3, 33), the first projection (7, 37) and the second projection (8, 38) so that the end of the substrate (20) can be inserted into the space between the first projection (7, 37) and the second projection (8, 38) and the substrate (20) can be fixed angularly to the plate (22, 40).

19 Claims, 16 Drawing Figures

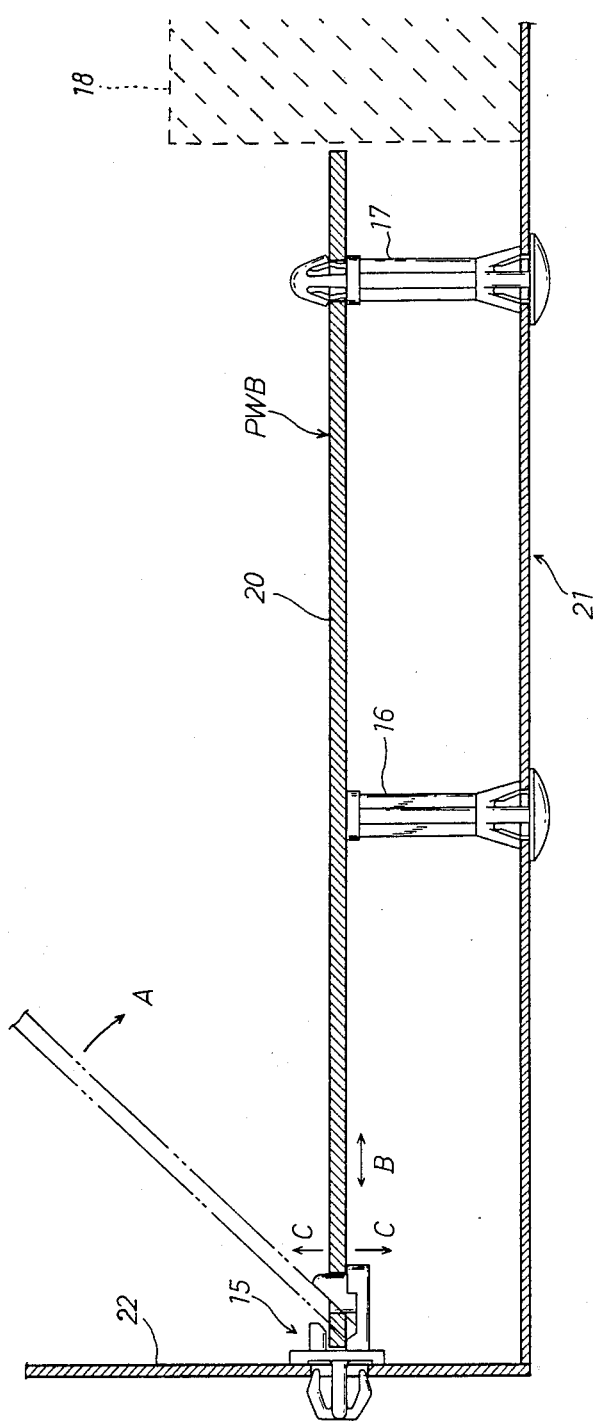

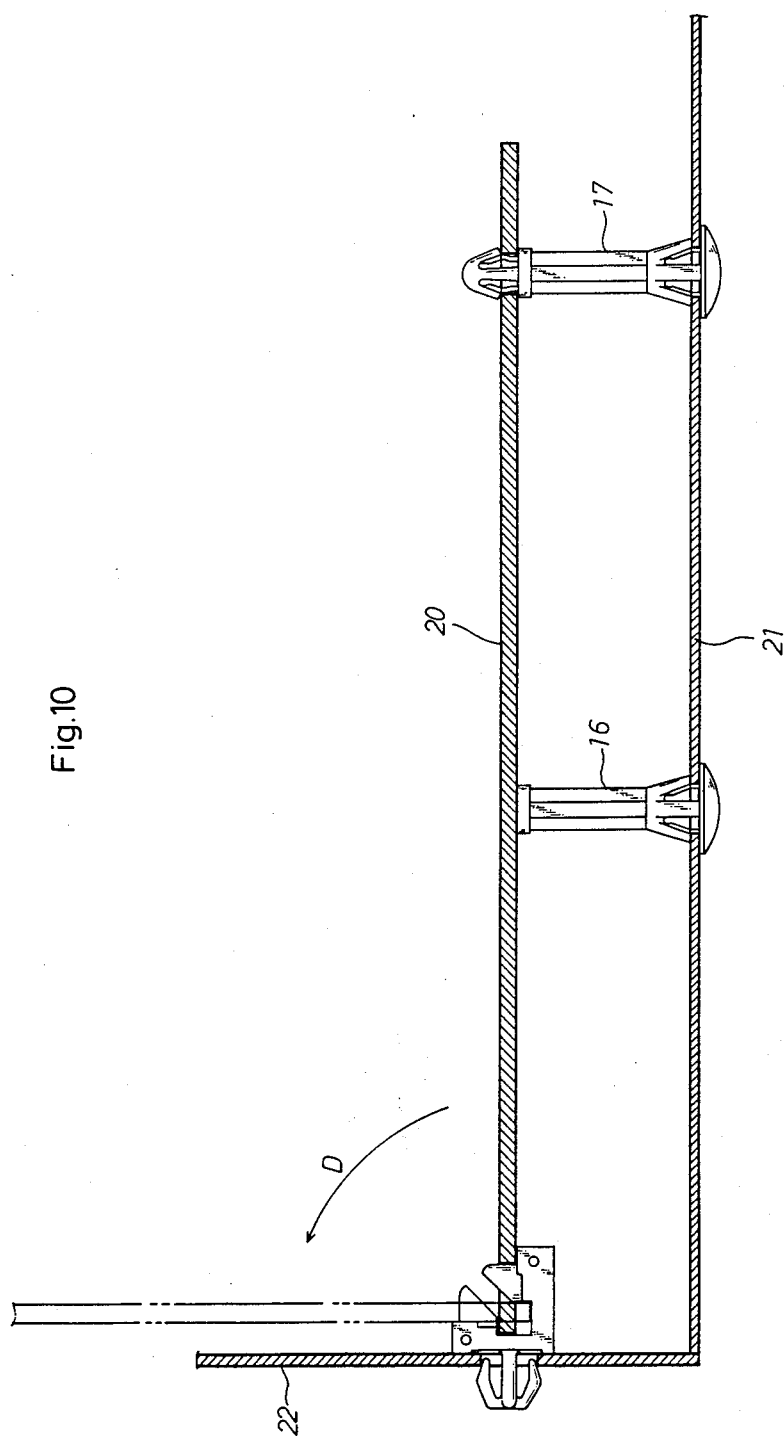

SUBSTRATE SUPPORT OF INTEGRAL CONSTRUCTION

BACKGROUND OF THE INVENTION

1. Technical Field

The present invention relates to a substrate support for holding the end of a substrate such as a printed circuit board fitted perpendicularly to or in parallel with a plate such as the chassis or printed circuit board of an electronic apparatus and mounting panel, so that the substrate can be optionally detached from the plate.

2. Prior Art

A substrate support for holding a substrate at the end to fit the substrate perpendicularly to a plate such as the chassis or printed circuit board of an electronic apparatus and a mounting panel has been known. The substrate support of such kind comprises a fixing portion fixed in the attaching hole of the plate, and a holding portion in which two holding elements are erected in parallel at a prescribed distance from each other on a base. The substrate is inserted between the two holding elements to pinch the end of the substrate to hold it.

However, since a substrate is only pinched between two holding elements in a conventional substrate support as mentioned above, there is a problem that the substrate can easily move in the direction of its surface and easily drop out of, due to vibration or the like. In addition, there is another problem that the substrate cannot be inserted between the two holding elements and therefore cannot be held at the end, when the substrate cannot be moved to be attached, in the direction of its surface, because of the presence of another article around the substrate.

OBJECT OF THE INVENTION

The object of the present invention is to provide a substrate support by which a substrate can be held firmly enough not to move due to vibration or the like and to which the substrate can be easily attached by only inserting the substrate obliquely at a prescribed angle and moving the substrate vertically. The constitution of the present invention for attaining the foregoing object is embodied as a substrate support of integral construction, by which substrates (20, 39) can be fixed perpendicularly to plates (22, 40) and which includes the followings:
- a base (3, 33);
- a fixing portion (1, 31) for coupling the base (3, 33) to the plate (22, 40);
- a first projection (7, 37) extending from the base (3, 33); and
- a second projection (8, 38) extending from a wall (9) extending from the base (3, 33);
- the substrate (20) being gripped by the base (3, 33), the first projection (7, 37) and the second projection (8, 38) so that the end of the substrate (20) can be inserted into the space between the first projection (7, 37) and the second projection (8, 38) and the substrate (20) can be fixed angularly to the plate (22, 40).

The fixing portion, which is fixed on the plate, serves to fasten the substrate support to the plate such as a chassis, a printed circuit board, a mounting panel or the like, and may be whatever can be fixed on the plate, such as a portion employing an elastic check piece fitted in the attaching hole of the plate, and a portion employing an adhesive tape, an adhesive agent or the like to stick the portion directly to the surface of the plate.

The first projection, which extends from the base, serves to engage and hold one side of the end of the substrate, and may be a projection or projections extending in parallel with the wall, or plural small projections juxtaposed in a row. What is required of the first projection is that by which one side of the end of the substrate is engaged and held after the substrate is attached and that the substrate does not drop out of the substrate support when and after the substrate is attached.

The wall has the second projection extending from the base just as the first projection and fitted in the fixation hole of the substrate. The second projection is placed in contact with the side of the substrate opposite to the first projection so that the first and the second projections hold the substrate perpendicularly to the base and the second projection keeps the substrate from moving in the direction of the surface of the substrate and dropping out of the holding portion of the support.

When the substrate support provided according to the present invention is to put in use, what needs to be done is to fix the support on the plate by fixation elements, then obliquely insert the substrate in between the first projection and the wall, and tilt the substrate down so as to fit the second projection in the fixation hole of the substrate. The substrate can thus be firmly fixed at the end by simple work.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

FIG. 6 shows an explanatory view indicating an example of the use of the substrate support.

FIG. 10 shows an explanatory view indicating an example of the use of the second embodiment.

DETAILED DESCRIPTION OF PREFERRED EMBODIMENTS

Figure 1:
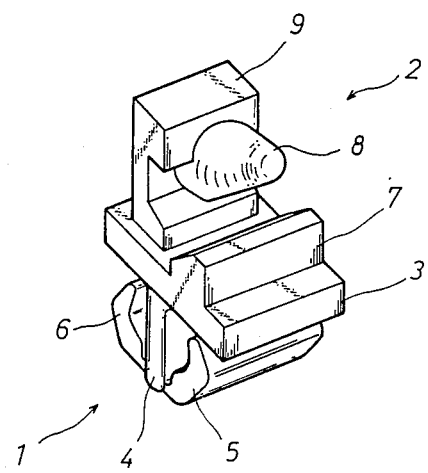
FIG. 1 shows an oblique view of the whole of a substrate support which is a first embodiment of the present invention.

Preferred embodiments of the present invention are hereinafter described referring to the drawings.

Figure 2:
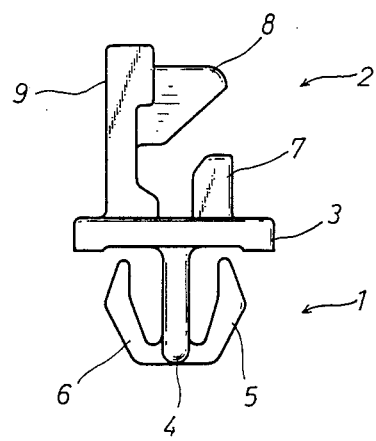
FIG. 2 shows a front view of the substrate support of FIG. 1.
Figure 4:
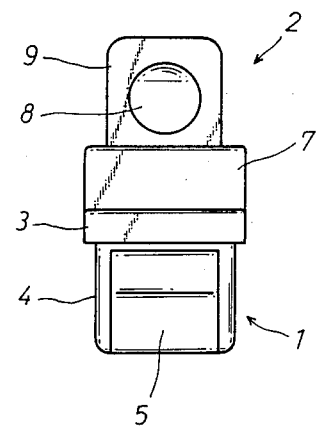
FIG. 4 shows a right-hand side view of the substrate support of FIG. 1.
Figure 3:
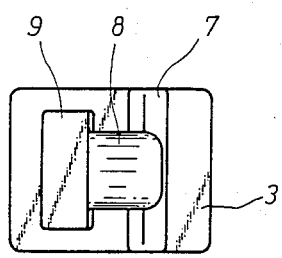
FIG. 3 shows a plan view of the substrate support of FIG. 1.

FIG. 1 shows an oblique view of the whole of a substrate support which is the first embodiment of the present invention. FIG. 2 shows a front view of the substrate support. FIG. 3 shows a plan view of the substrate support. FIG. 4 shows a right-hand side view of the substrate support. Shown in these drawings are a fixing portion 1 for fixing the support on a plate, and a holding portion 2 for holding a substrate.

The fixing portion 1 includes a flat pillar 4 extending down from the center of the bottom of a base 3 and two elastic check elements 5 and 6 extending obliquely up from the end of the flat pillar 4. When the fixing portion 1 is fitted in an attaching hole in a plate, the support can be fixed on the plate by the elastic forces of the elastic check elements 5 and 6.

Figure 5A:
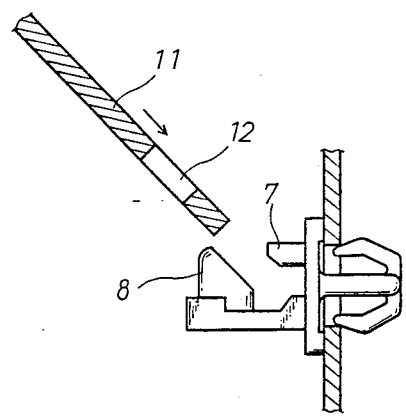
FIG. 5 shows a view for explaining how to attach a substrate to the substrate support of FIG. 1.
Figure 5B:
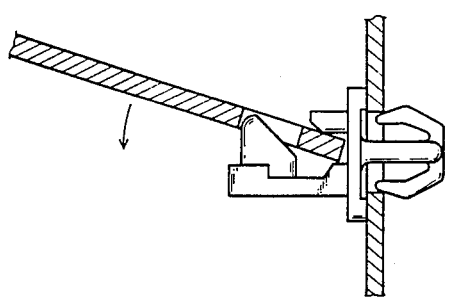
Figure 5C:
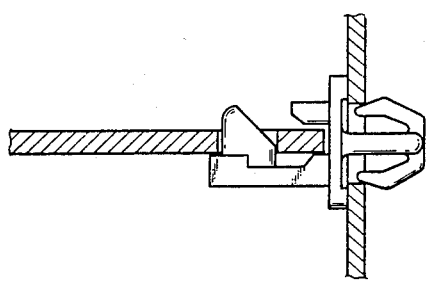

The holding portion 2 includes a first projection 7 extending from the top of the base 3 and a wall 9 which extends in parallel with the first projection 7 and has a second projection 8. In use, the second projection 8 is fitted in a fixation hole in a substrate. The second projection 8 is shaped as an obliquely-cut cylinder rounded on the cut end. The cut end face of the second projection 8 is located in front of the first projection 7 so that the substrate can be easily inserted between the first and the second projections. As shown in FIG. 5, to attach a substrate 11 to the support, the substrate 11 is obliquely inserted into the gap defined by the first projection 7 and the second projection 8, and the substrate is tilted down so that the second projection 8 is fitted in a fixation hole 12 while the front end of the substrate 11 is engaged with the first projection 7. For that reason, the second projection 8 is previously provided with the cut end face for making it easy to insert the substrate 11 at first. In this embodiment, the part of the first projection 7 which faces the second projection 8 is chamfered for the same purpose as the cut end face of the second projection 8. The angles of the cut end face and the chamfering can be set at desired values to determine the angle of the insertion of the substrate 11 at the time of the attachment of the substrate.

The substrate support of the above-mentioned construction is integrally molded from a synthetic resin such as nylon, and put in use as shown in FIG. 6. Shown at 15 in FIG. 6 is the substrate support which is put in use together with fixation members 16, 17 which are different in form from the substrate support 15 and hold a substrate at a distance from the plate. It will be understood from FIG. 6 that the substrate can be held perpendicularly to a plate to which the substrate support 15 is attached.

According to the foregoing constitution, when a printed circuit board 20 is to be held over a chassis plate 21 in parallel therewith, the substrate support 15 is attached to another chassis plate 22 so that the printed circuit board 20 is firmly fixed at the end. The second projection 8 prevents the printed circuit board 20 from moving in a direction B, and the first projection 7 and the wall 9 prevent the printed circuit board 20 from moving in another direction C. To use the substrate support 15 in the above-mentioned manner, the printed circuit board 20 is obliquely inserted into the substrate support 15 at first, as shown by a broken line in FIG. 6, and it is thereafter only tilted down in the direction A.

The printed circuit board 20 can thus be easily attached even in a case that the printed circuit board cannot be inserted into a conventional support of insertion type and therefore cannot be held at the end because there is an article 18 near the attached position of the printed circuit board 20 as shown by a dotted line in FIG. 6.

Figure 7:
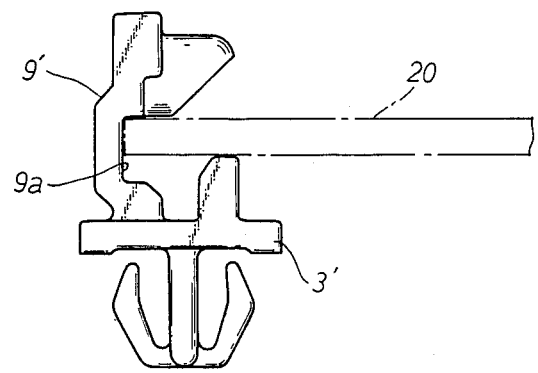
FIG. 7 shows a front view of a substrate support provided by forming a recess on the wall of the first embodiment.

While the first embodiment is a substrate support by which the substrate can be held perpendicularly to the plate and be fixed, FIG. 7 shows a variant of the first embodiment in which a wall 9' of the substrate support is formed with a recess 9a on the surface with which the plate is to be brought into contact, so that the printed circuit board 20 can be temporarily held in parallel with the base 3' of a support, as shown by a one-dot chain line in FIG. 7, thus enhancing the work efficiency in the checking, maintenance, and/or repairing of the printed circuit board 20.

Figure 8:
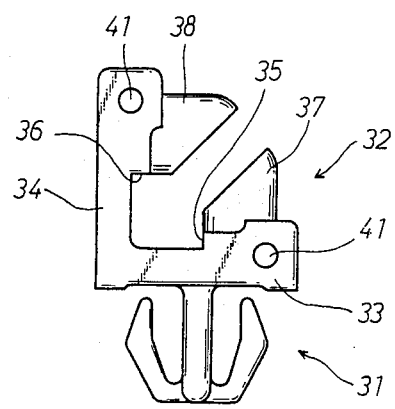
FIG. 8 shows a front view of a substrate support which is a second embodiment of the present invention.

The second embodiment of the present invention is hereinafter described. This embodiment is a substrate support by which a substrate can be held either perpendicularly to or in parallel with a plate to which the support is attached. FIG. 8 shows a front view of the substrate support. Shown at 31 and 32 in FIG. 8 are a fixing portion and a holding portion, respectively. Though the first projection 7 and the wall 9 extend from the base 3 in the first embodiment, two bases 33 and 34 are perpendicularly crossed with each other in the second embodiment. The bases 33 and 34 are each provided with a first projection 35 and 36, respectively, and a second projection 37 and 38, so that one base 33 or 34 serves as a wall when the other base 34 or 33 is used to face the end of a substrate.

Figure 9A:
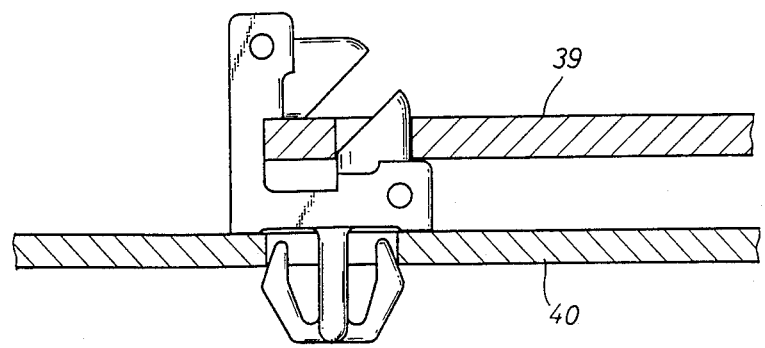
FIG. 9 shows a view for explaining how to use the second embodiment.
Figure 9B:
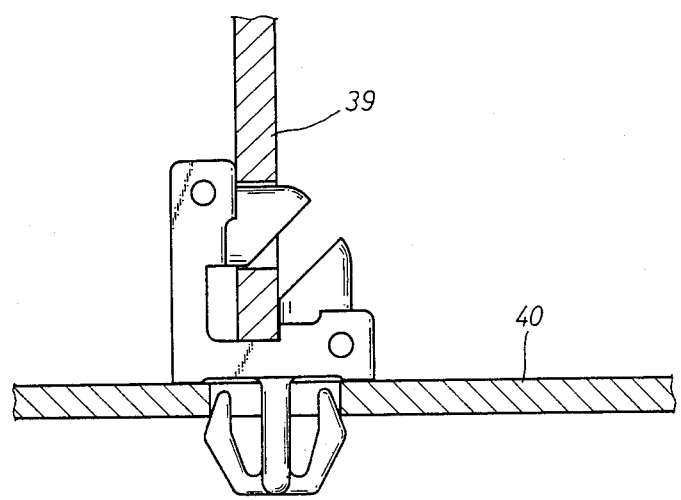

As shown in FIG. 9, with the substrate support which is the second embodiment, a substrate 39 can be fixed either perpendicularly to or in parallel with a plate 40 to which the support is attached. For example, when a printed circuit board 20 is held in parallel with a chassis plate 21 by the substrate support and fixation members 16 and 17 different in form from the support, as shown in FIG. 10, the printed circuit board 20 can be turned in a direction D and then fixed to enhance the work efficiency in the checking, maintenance, and/or repairing of the board 20.

Shown at 41 in FIG. 8 are circular holes provided to save the synthetic resin for molding the substrate support. In the second embodiment, the circular holes are located in the bases 33 and 34 near the second projection 37 and 38. The second projections 37 and 38 are formed in the same manner as the first embodiment, and the tips of the projections are cut to define a prescribed gap into which the substrate can be inserted.

Figure 12:
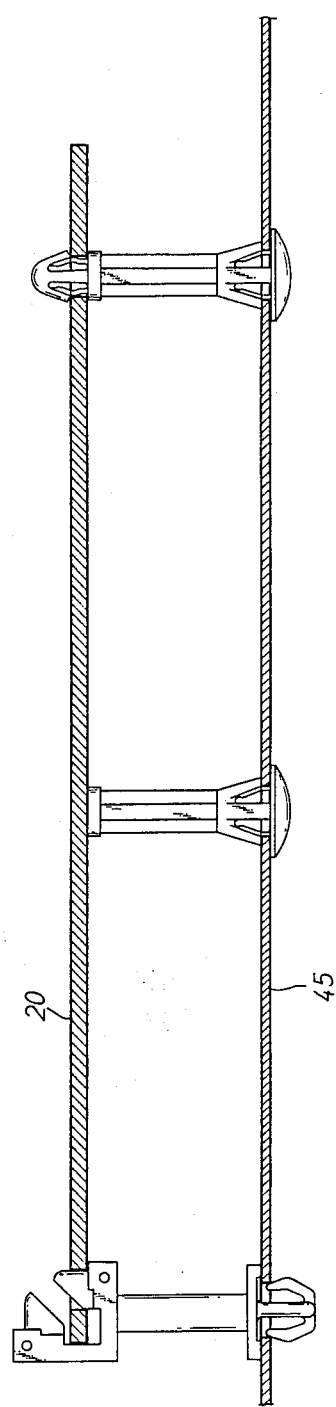
FIG. 12 shows an explanatory view indicating an example of the use of the third embodiment.
Figure 11:
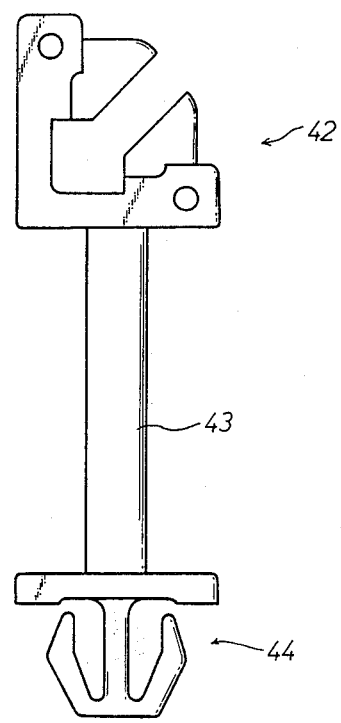
FIG. 11 shows a front view of a substrate support which is a third embodiment of the present invention.

FIG. 11 shows a third embodiment of the present invention, which is a substrate support in which a holding portion 42 having the same form as the holding portion 32 in the second embodiment is provided with a pillar 43 on a fixing portion 44. As shown in FIG. 12, if the length of the pillar 43 is appropriately set, a printed circuit board 20 can be held at a prescribed distance over a chassis 45 in parallel therewith.

Although in all the illustrated embodiments, the substrate supports have elastic check elements in the fixing portions, the form of each of the fixing portions may be optionally determined so long as the support can be firmly fixed on the plate such as a chassis. For example, the fixing portion may be composed of a base, which is placed in contact with the plate, and an adhesive tape, which is provided on the base to stick the support to the plate as it is.

Figure 13:
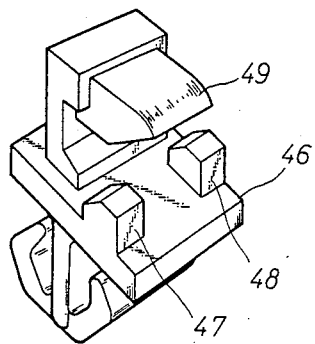
FIG. 13 shows an oblique view of a substrate support whose first and a second projections are different in form from those of the first, the second, and the third embodiments.

Although the second projection of each of the previously discussed embodiments has a cylindrical shape and the first projection of each of those embodiments is a continuous projection, as shown in FIG. 13, the first projection may be made of two projections 47 and 48 extending from a base 46, and the second projection may be made of a prism-shaped projection 49. If the prism-shaped projection 49 is provided in each of the embodiments, the fixation hole of the substrate needs to have an angular cross section.

As described in detail above, the substrate support provided according to the present invention has a holding portion which holds the substrate and includes a first projection extending from a base, and the wall having a second projection, so that a substrate can be firmly fixed by the second projection not to drop out of the support due to vibration or the like. When the substrate is to be attached to the support, the substrate does not need to be moved in the direction of the surface of the substrate in order to be inserted into the substrate support as in conventional substrate supports, but the substrate can be obliquely inserted at the side of the first projection and tilted down as it is, so that the substrate can be easily and surely attached. For that reason, even if there is an article around the attaching portion for the substrate, the substrate can be held firmly so long as there is a space obliquely over the attaching portion.

Obviously, numerous modifications and variations of the present invention are possible in the light of the above teachings. It is therefore understood that, within the scope of the appended claims, the invention may be practiced otherwise than a specifically described herein.

What is claimed is:

1. A substrate support of integral construction by which a substrate (20, 39) can be fixed angularly relative to a plate (22, 40), said substrate support comprising:
   (a) a first base (3, 3', 33);
   (b) a fixing portion (1, 31) for coupling said first base (3, 3', 33) to a plate (22, 40);
   (c) a first projection (7, 37) extending from said first base (3, 3', 33);
   (d) a wall (9, 34) extending from said first base (3, 3', 33) at least generally parallel to said first projection (7, 37); and
   (e) a second projection (8, 38) extending from said wall (9, 34) toward said first projection (7, 37) but leaving a space therebetween, said second projection (8, 38) being integral with said wall (9, 34) and said first projection (3, 37) and said second projection (8, 38) having the same form and having slopes facing each other,
   whereby, in use, a substrate (20, 39) is gripped by said first base (3, 3', 33), said first projection (7, 37), and said second projection (8, 38) so that an end of the substrate (20, 39) can be inserted into the space between said first projection (7, 37) and said second projection (8, 38) and the substrate (20, 39) can be fixed angularly relative to a plate (22, 40).

2. A substrate support of integral construction as described in claim 1, wherein said first projection (7, 37) and said second projection (8, 38) are sized, shaped, and positioned so that the end of the substrate (20, 39) can be inserted into the space obliquely to said first base (3, 3', 33).

3. A substrate support of integral construction as described in claim 1, wherein the substrate (20, 39) can be fixed either perpendicularly to or in parallel with the plate (22, 40).

4. A substrate support of integral construction as described in claim 1, wherein said wall (9, 34) has a recess (9a) in which the end of the substrate (20, 39) is placed.

5. A substrate support of integral construction as described in claim 1, wherein, in use, said second projection (8, 38) is inserted through a hole (12) in the substrate (20, 39).

6. A substrate support of integral construction as described in claim 1, wherein either said first projection (7, 37) or said second projection (8, 38) can be inserted through the hole (12) of the substrate.

7. A substrate support of integral construction as described in claim 1, wherein a pillar (43) extends from said first base (3, 3', 33) so that said first projection (7, 37) and said second projection (8, 38) are spaced from said fixing portion (1, 31) by said base (3, 3', 33) and said pillar (43).

8. A substrate support of intergral construction as described in claim 1, wherein, in use the plate (22, 40) is a chassis, a printed circuit board, or a mounting panel.

9. A substrate support of integral construction as recited in claim 1 wherein said first projection (7,37) extends perpendicularly to said first base (3,3',33).

10. A substrate support of integral construction as recited in claim 1 wherein said first base (3,3',33), said first projection (7,37), and said second projection (8,38) are sized, shaped, and positioned so that the end of the substrate (20,39) that is inserted into the space between said first projection (7,37) and said second projection (8,38) passes through the space at one angular orientation relative to said first base (3,3',33) and then is pivoted into a fixed angular orientation relative to said first base (3,3',33).

11. A substrate support of integral construction by which a substrate (39) can be fixed angularly relative to a plate (40), said substrate support comprising:
   (a) a first base (3, 3', 33);
   (b) a fixing portion (1, 31) for coupling said first base (3, 3', 33) to a plate (40);
   (c) a first projection (7, 37) extending from said first base (3, 3', 33);
   (d) a second base (34) extending from said first base (3, 3', 33) at least generally parallel to said first projection (7, 37); and
   (e) a second projection (38) extending from said second base (34) toward said first projection (7, 37) but leaving a space therebetween, said second projection (38) being integral with said second base (34);
   (f) said first (33) and second (34) bases and said first (37) and second (38) projections being at least substantially symmetrical to each other,
   whereby, in use, a substrate (39) is gripped by said first base (3, 3', 33), said first projection (7, 37), and said second projection (38) so that an end of the substrate (39) can be inserted into the space between said first projection (7, 37) and said second projection (38) and the substrate (39) can be fixed angularly relative to a plate (40).

12. A substrate support of integral construction as described in claim 11, wherein said first projection (7, 37) and said second projection (38) are sized, shaped, and positioned so that the ends of the substrate (39) can be inserted into the space obliquely to said first base (3, 3', 33).

13. A substrate support of integral construction as described in claim 11, wherein the substrate (39) can be fixed either perpendicularly to or in parallel with the plate (40).

14. A substrate support of integral construction as described in claim 11, wherein said second base (34) has a recess (9a) in which the end of the substrate (39) is placed.

15. A substrate support of integral construction as described in claim 11, wherein, in use, said second projection (38) is inserted through a hole (12) in the substrate (39).

16. A substrate support of integral construction as described in claim 11, wherein a pillar (43) extends from said first base (3, 3', 33) so that said first projection (7, 37) and said second projection (38) are spaced from said fixing portion (1, 31) by said first base (3, 3', 33) and said pillar (43).

17. A substrate support of integral construction as described in claim 11, wherein, in use the plate (40) is a chassie, a printed circuit board, or a mounting panel.

18. A substrate support of integral construction as described in claim 11, wherein said first projection (7, 37) extends perpendicularly to said first base (3, 3', 33).

19. A substrate support of integral construction as described in claim 11, wherein said first base (3, 3', 33), said first projection (7, 37), and said second projection (38) are sized, shaped, and positioned so that the end of the substrate (39) that is inserted into the space between said first projection (7, 37) and said second projection (38) passes through the space at one angular orientation relative to said first base (3, 3', 33) and then is pivoted into a fixed angular orientation relative to said first base (3, 3', 3).

* * * * *